United States Patent
Kim

(10) Patent No.: US 9,054,217 B2
(45) Date of Patent: Jun. 9, 2015

(54) METHOD FOR FABRICATING SEMICONDUCTOR DEVICE HAVING AN EMBEDDED SOURCE/DRAIN

(71) Applicant: SAMSUNG ELECTRONICS CO., LTD., Suwon-si, Gyeonggi-do (KR)

(72) Inventor: Jin-Bum Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/029,326

(22) Filed: Sep. 17, 2013

(65) Prior Publication Data

US 2015/0079740 A1    Mar. 19, 2015

(51) Int. Cl.
*H01L 21/8238*    (2006.01)
*H01L 21/28*    (2006.01)
*H01L 29/66*    (2006.01)
*H01L 21/033*    (2006.01)

(52) U.S. Cl.
CPC ...... *H01L 21/8238* (2013.01); *H01L 21/28008* (2013.01); *H01L 21/823814* (2013.01); *H01L 29/66477* (2013.01); *H01L 21/0334* (2013.01)

(58) Field of Classification Search
CPC ....................... H01L 27/0925; H01L 29/66409
See application file for complete search history.

(56) References Cited

U.S. PATENT DOCUMENTS

| | | | |
|---|---|---|---|
| 7,399,663 B2 | 7/2008 | Hoentschel et al. | |
| 7,667,227 B2 | 2/2010 | Shimamune et al. | |
| 7,863,197 B2 | 1/2011 | Chen et al. | |
| 7,951,657 B2 | 5/2011 | Cheng et al. | |
| 8,071,442 B2 | 12/2011 | Kronholz et al. | |
| 2010/0078691 A1 | 4/2010 | Mulfinger et al. | |
| 2011/0062494 A1 | 3/2011 | Engelmann et al. | |
| 2011/0070703 A1 | 3/2011 | Xiong et al. | |
| 2011/0159655 A1* | 6/2011 | Adam et al. | 438/285 |
| 2011/0183481 A1 | 7/2011 | Dyer | |
| 2011/0294269 A1 | 12/2011 | Wirbeleit et al. | |

* cited by examiner

*Primary Examiner* — Cheung Lee
(74) *Attorney, Agent, or Firm* — F. Chau & Associates, LLC

(57) ABSTRACT

A method for fabricating a semiconductor device is provided. A first gate pattern and a second gate pattern are adjacent to each other and are formed on an active region of a substrate. The active region is defined by an isolation film. A first recess is formed between the first gate pattern and the second gate pattern. A first sacrificial film pattern is formed on a bottom surface of the first recess using a directional deposition process. A second recess is formed by etching the first recess using the first sacrificial film pattern as a etch mask. The first recess is laterally extended to form the second recess.

18 Claims, 8 Drawing Sheets

US 9,054,217 B2

METHOD FOR FABRICATING SEMICONDUCTOR DEVICE HAVING AN EMBEDDED SOURCE/DRAIN

TECHNICAL FIELD

The inventive concept relates to a method for fabricating a semiconductor device, and more specifically, to a method for fabricating a semiconductor device having to an embedded source/drain.

DISCUSSION OF RELATED ART

Electronic devices have been developed to include semiconductor devices that operate quickly and reliably. Additionally, semiconductor devices are becoming increasingly small. Various structures of a transistor have been proposed to implement semiconductor devices operating quickly and reliably in a reduced size.

SUMMARY

According to an exemplary embodiment of the present inventive concept, a method for fabricating a semiconductor device is provided. A first gate pattern and a second gate pattern are adjacent to each other and are formed on an active region of a substrate. The active region is defined by an isolation film. A first recess is formed between the first gate pattern and the second gate pattern. A first sacrificial film pattern is formed on a bottom surface of the first recess using a directional deposition process. A second recess is formed by etching the first recess using the first sacrificial film pattern as a etch mask. The first recess is laterally extended to form the second recess.

According to an exemplary embodiment of the present inventive concept, a method for fabricating a semiconductor device is provided. A first gate pattern is formed on a PMOS forming region of a substrate. A second gate pattern is formed on an NMOS forming region of the substrate. A first recess is formed on both sides of the first gate pattern. A sacrificial film pattern is formed on a bottom surface of the first recess using a directional deposition process. A second recess is formed by etching the first recess using the first sacrificial film pattern as a etch mask.

According to an exemplary embodiment of the present inventive concept, a method for fabricating a semiconductor device is provided. A first gate pattern and a second gate pattern are formed on an active region of a substrate. The active region is defined by an isolation film formed in the substrate. A first recess having a bottom surface and a first curved side surface is formed in the substrate. The bottom surface is disposed under a region between the first gate pattern and the second gate pattern. The first curved side surface is disposed under the first gate pattern. A sacrificial layer is formed on the bottom surface of the first recess. An isotropic etching process is performed on the first recess using the sacrificial layer as an etch mask to form a second recess. The second recess includes a second side surface disposed farther from the sacrificial layer than the first curved side surface. A sigma-shaped recess is formed by etching the second recess.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
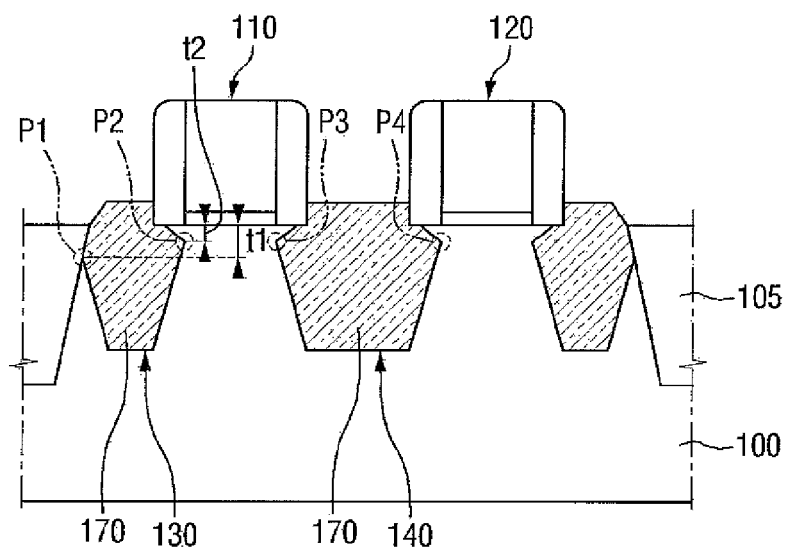
FIG. 1 is a cross-sectional view illustrating a semiconductor device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when a layer is referred to as being "on" another layer or substrate, it may be directly on the other layer or substrate, or intervening layers may also be present. Like reference numerals may refer to the like elements throughout the specification and figures.

The singular forms "a" and "an" and "the" and similar referents are intended to cover the plural forms as well, unless the context clearly indicates otherwise.

Hereinafter, referring to FIG. 1, a semiconductor device according to an exemplary embodiment of the inventive concept will be described.

FIG. 1 is a cross-sectional view illustrating a semiconductor device according to an exemplary embodiment of the inventive concept.

Referring to FIG. 1, a semiconductor device 1 includes a substrate 100, gate patterns 110 and 120, a first recess 130, a second recess 140, and a semiconductor pattern 170.

An isolation film 105, which defines an active region on which the gate patterns 110 and 120 are formed, is formed in the substrate 100. The substrate 100 may include, but is not limited to, a bulk silicon substrate, an SOI (Silicon-On-Insulator) substrate, or a substrate having a material including silicon genuanium, indium antimonide, lead telluride indium arsenide, indium phosphorus, gallium arsenide, or gallium antimonide. Hereinafter, it is described that the substrate 100 includes a silicon substrate. The isolation film 105 may include, but is not limited to, an STI (Shallow Trench Isolation) structure.

The first gate pattern 110 and the second gate pattern 120 may be formed on the active region of the substrate 100 that is defined by the isolation film 105. In an exemplary embodiment of the inventive concept, two gate patterns 110 and 120 are formed on the active region, but the inventive concept is not limited thereto. Each of the first gate pattern 110 and the second gate pattern 120 may include a gate insulating film, a gate electrode, and a gate spacer.

The gate insulating film may include, for example, silicon oxide film, SiON, $Ge_xO_yN_z$, $Ge_xSi_yO_z$, a high-k dielectric material, or a combination thereof. The gate insulating film may include a stacked film including the above-described materials stacked on each other. The high-k dielectric film may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but is not limited thereto. If the gate insulating film includes a high-k dielectric material, a barrier layer (not illustrated) may be further formed between the gate insulating film and the gate electrode. The barrier layer may include, for example, titanium nitride (TiN), tantalum nitride (TaN), or a combination thereof.

The gate electrode may include, but is not limited to, silicon, poly silicon (poly Si), amorphous silicon (a-Si), or a metal electrode that includes a metal material. The spacer may include, for example, a silicon nitride film, a silicon oxynitride film, a silicon oxide film, or a silicon oxycarbonitride (SiOCN) film. The spacer may be formed as a single layer, but it is not limited thereto. For example, the spacer may be formed as a multilayer structure.

The first recess 130 may be formed in the substrate 100, and may be formed on one side of the gate patterns 110 and 120. For example, the first recess 130 may be formed between the gate patterns 110 and 120 and the isolation film 105.

The second recess 140 may be formed in the substrate 100, and may be formed between the first gate pattern 110 and the second gate pattern 120. The first recess 130 may be formed on one side of the first gate pattern 110. The second recess 140 may be formed on the other side of the first gate pattern 110. Accordingly, the first recess 130 is closer to the isolation film 105 than the second recess 140.

In a semiconductor device according to an exemplary embodiment of the inventive concept, the first recess 130 and the second recess 140 may have a sigma shape in a cross-sectional view.

In a semiconductor device according to an exemplary embodiment of the inventive concept, the first recess 130, which is formed between the gate patterns 110 and 120 and the isolation film 105, is formed in contact with the isolation film 105. For example, at least a part of a side surface of the first recess 130 that is adjacent to the isolation film 105 and a side surface of the isolation film 105 may constitute a boundary therebetween.

The first recess 130, which is formed between the gate patterns 110 and 120 and the isolation film 105, may include a first tip P1 and a second tip P2. The first tip P1 of the first recess 130 may be formed adjacent to the isolation film 105. The first tip P1 of the first recess 130 may be located adjacent to an upper surface of the substrate 100. For example, the first tip P1 is formed at a first depth t1 from the upper surface of the substrate 100. The upper surface of the substrate 100 may be a boundary where the substrate 100 and the first gate pattern 110 are in contact with each other. The second tip P2 of the first recess 130 may be formed adjacent to a channel region of the first gate pattern 110. The second tip P2 of the first recess 130 may be located adjacent to an upper surface of the substrate 100. For example, the second tip P2 may be at a second depth t2 from the boundary where the substrate 100 and the first gate pattern 110 are in contact with each other. Here, the term "tip" means a pointed portion of a side of the recess. The first tip P1 of the first recess 130 is closer to the isolation film 105 than the second tip P2 of the first recess 130. For example, the first tip P1 of the first recess 130 may constitute a part of the side of the isolation film 105.

The first tip P1 of the first recess 130 is located at a depth that is different from a depth of the second tip P2 of the first recess 130. For example, the first depth t1 of the first tip P1 is different from the second depth t2 of the second tip P2. The first recess 130 includes the first tip P1 and the second tip P2 which are located at different depths. In a semiconductor device according to an exemplary embodiment of the inventive concept, the first depth t1 of the first tip P1 may be greater than the second depth t2 of the second tip P2.

The second recess 140, which is formed between the first gate pattern 110 and the second gate pattern 120, may include a third tip P3 and a fourth tip P4. The third tip P3 and the fourth tip P4 of the second recess 140 may be formed adjacent to the first gate pattern 110 and the second gate pattern 120, respectively. The third tip P3 of the second recess 140 may be located at a third depth t3 from the upper surface of the substrate 100, and the fourth tip P4 of the second recess 140 may be located at a fourth depth t4 from the upper surface of the substrate 100. The third tip P3 of the second recess 140 and the fourth tip P4 of the second recess 140 may be located at substantially the same depth. Further, the third tip P3 of the second recess 140 and the fourth tip P4 of the second recess 140 may be located at substantially the same depth as the second tip P2 of the first recess 130.

The semiconductor pattern 170 may be formed in the first recess 130 and the second recess 140, and may protrude between the gate patterns 110 and 120 and the isolation film 105. The semiconductor pattern 170 may also protrude between the first gat pattern 110 and the second gate pattern 120. Since the first recess 130 exposes a portion of the isolation film 105, the semiconductor pattern 170 that is formed in the first recess 130 is formed on the isolation film 105. The semiconductor pattern 170 may serve to apply a tensile or compressive stress to a corresponding channel region of the first gate pattern 110 and the second gate pattern 120, and thus, the performance of the semiconductor device may be increased. The semiconductor pattern 170 may include, for example, a source and a drain of a transistor. The semiconductor pattern 170 may be formed by filling a semiconductor material in the first recess 130 and the second recess 140 using an epitaxial growth process. For example, the semiconductor pattern 170 may include a single-crystal epitaxial layer. In the case where the semiconductor pattern 170 applies a tensile or compressive stress to a channel region under the gate patterns 110 and 120, the semiconductor pattern 170 may include a material that has a different lattice constant from that of the substrate 100.

For example, in the case of a p-type metal-oxide-semiconductor (PMOS) transistor using holes as a current carrier, the semiconductor pattern 170 may apply a compressive stress to the substrate 100. The semiconductor pattern 170 may include a material having a larger lattice constant than that of the substrate 100. For example, in the case of a silicon substrate, the semiconductor pattern 170 may include silicon germanium (SiGe) that has a larger lattice constant than that of silicon.

For example, in the case of an n-type MOS (NMOS) transistor using electrons as a current carrier, the semiconductor pattern 170 may apply a tensile stress to the substrate 100. The semiconductor pattern 170 may include a material having a smaller lattice constant than that of the substrate 100. For example, in the case of a silicon substrate, the semiconductor pattern 170 may include silicon carbide (SiC) that has a smaller lattice constant than that of silicon. However, in the case where the semiconductor device is the n-type MOS (NMOS) transistor, a protruded silicon epitaxial film may be formed as the semiconductor pattern 170 in the first recess 130 and the second recess 140.

Referring to FIGS. 2 to 8, a method for fabricating a semiconductor device according to an exemplary embodiment of the inventive concept will be described.

FIGS. 2 to 8 are cross-sectional views illustrating process steps of a method for fabricating a semiconductor device according to an exemplary embodiment of the inventive concept.

Figure 2:
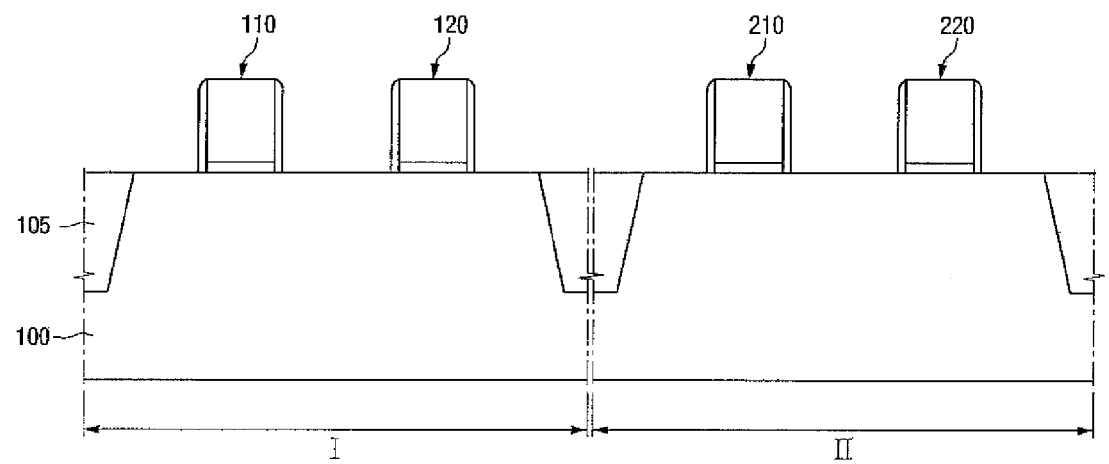
FIGS. 2 to 8 are cross-sectional views illustrating steps of a method for fabricating a semiconductor device according to an exemplary embodiment of the inventive concept.

Referring to FIG. 2, first to fourth gate patterns 110, 120, 210, and 220 are formed on the substrate 100 that includes a first active region I and a second active region II. For example, the first gate pattern 110 and the second gate pattern 120 may be formed on the first active region I, and the third gate pattern 210 and the fourth gate pattern 220 may be formed on the second active region II.

The first active region I of the substrate 100 may include a PMOS forming region, and the second active region II of the substrate 100 may include an NMOS forming region. However, the inventive concept is not limited thereto.

For example, an isolation film 105 may be formed in the substrate 100 by filling a trench formed in the substrate 100 with an insulating material. The first active region I and the second active region II may be defined by the isolation film 105 formed in the substrate 100. For example, the substrate 100 may include a silicon substrate.

The first gate pattern 110 and the second gate pattern 120, which are adjacent to each other, are formed on the first active region I of the substrate 100. The third gate pattern 210 and the fourth gate pattern 220, which are adjacent to each other, are formed on the second active region II of the substrate 100. The first gate pattern 110 and the second gate pattern 120, which are formed on the first active region I, and the third gate pattern 210 and the fourth gate pattern 220, which are formed on the second active region II, may be simultaneously formed, but the inventive concept is not limited thereto.

The first to fourth gate patterns 110, 120, 210, and 220 may include gate insulating films, gate electrodes, and spacers. The gate insulating film may include silicon oxide, SiON, $Ge_xO_yN_z$, $Ge_xSi_yO_z$, a high-k dielectric material, or a combination thereof. The gate insulating film may include a stacked film including the above-described materials stacked on each other. The gate insulating film may be formed using a heat treatment process, a chemical material processing process, an atomic layer deposition (ALD) process, or a chemical vapor deposition (CVD) process. The gate electrode may include, but is not limited to, silicon, poly silicon (poly Si), amorphous silicon (a-Si), a metal material, or a combination thereof. The gate electrode may be formed using, for example, a sputtering process, a CVD process, or a plasma deposition process. The spacer may include, for example, a silicon nitride film, a silicon oxynitride film, a silicon oxide film, or a silicon oxycarbonitride (SiOCN) film, and may be formed using a CVD process or the like.

Although not illustrated in FIG. 2, a gate hard mask may be further formed on each gate electrode of the first to fourth gate patterns 110, 120, 210, and 220. The gate hard mask may serve to protect the gate electrode in the following process. The gate hard mask may include, for example, a nitride film, an oxide film, or a combination thereof, and may be formed, for example, using a CVD process.

Figure 3:
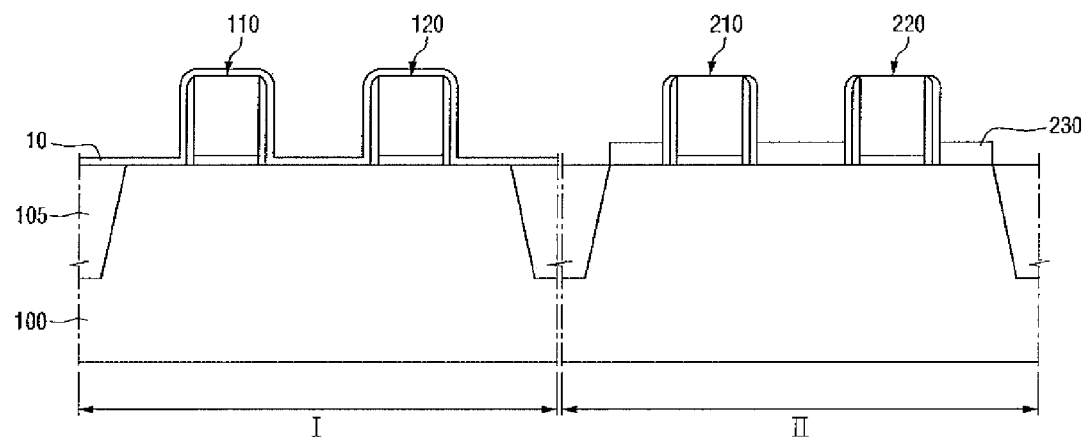

Referring to FIG. 3, a second source/drain layer 230 may be formed on both sides of the third gate pattern 210 and the fourth gate pattern 220 which are formed on the second active region II. The second source/drain layer 230 may be formed on an upper surface of the second active region II.

For example, a blocking film is formed on the first active region I and the second active region II. The blocking film is formed on the first to fourth gate patterns 110, 120, 210, and 220. The blocking film may include, for example, silicon oxide, silicon nitride, or silicon oxynitride. The blocking film may be formed, for example, using a CVD process or the like.

Thereafter, the substrate 100 of the second active region II, the third gate pattern 210, and the fourth gate pattern 220 are exposed by removing the blocking film on the second active region II. At the same time, a first blocking film 10 is formed on the first active region I. The first blocking film 10 is formed on the first gate pattern 110 and the second gate pattern 120. Although the blocking film on the second active region II is removed, the blocking film remains on side walls of the third gate pattern 210 and the fourth gate pattern 220 of the second active region II to form spacers.

After the first blocking film 10 is formed on the first active region I, the second source/drain layer 230 is formed on the exposed substrate 100 on both sides of the third gate pattern 210 and the fourth gate pattern 220. The second source/drain layer 230 may include an epitaxial layer, and may be formed, for example, using a CVD process or an ALD process. If the second active region II is a region where an NMOS transistor is formed, the second source/drain layer 230 may include, but is not limited to, a protruded silicon epitaxial film.

In an exemplary embodiment, the second source/drain layer 230 may be formed to project from the substrate 100. For example, after the third gate pattern 210 and the fourth gate pattern 220 is formed on the active region II, the second source/drain layer 230 is formed on both sides of the third gate pattern 210 and the fourth gate pattern 220.

Figure 4:
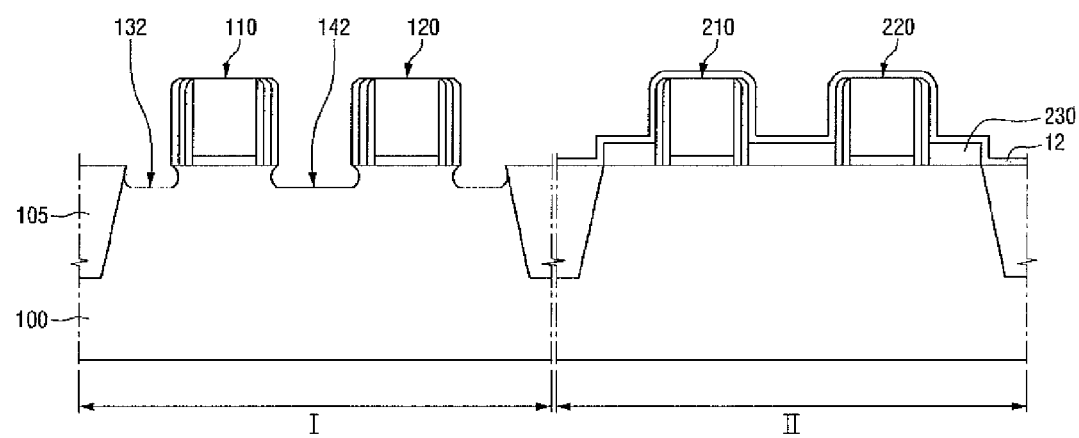

Referring to FIG. 4, a third recess 132 and a fourth recess 142 are formed on both sides of the first gate pattern 110 and the second gate pattern 120 which are formed on the first active region I. For example, the third recess 132 is formed between the first gate pattern 110 or the second gate pattern 120 and the isolation film 105, and the fourth recess 142 is formed between the first gate pattern 110 and the second gate pattern 120.

For example, a blocking film is formed on the first active region I and the second active region H. The blocking film is fowled on the first to fourth gate patterns 110, 120, 210, and 220 and the second source/drain layer 230. The blocking film may include, for example, silicon oxide, silicon nitride, or silicon oxynitride. The blocking film may be formed, for example, using a CVD process or the like.

Thereafter, the substrate 100 of the first active region I, the first gate pattern 110, and the second gate pattern 120 are exposed by removing the blocking film on the first active region I. At the same time, a second blocking film 12 is formed on the second active region II. The second blocking film 12 is formed on the third gate pattern 210, the fourth gate pattern 220, and the second source/drain layer 230. Although the blocking film on the first active region I is removed, the block film on side walls of the first gate pattern 110 and the second gate pattern 120 of the first active region I may remain on side walls of the first gate pattern 110 and the second gate pattern 120 as spacers.

Thereafter, a third recess 132 is formed by etching the exposed substrate 100 between the first gate pattern 110 and the isolation film 105 and between the second gate pattern 120 and the isolation film 105. Further, a fourth recess 142 is formed by removing the exposed substrate 100 between the first gate pattern 110 and the second gate pattern 120. The third recess 132 and the fourth recess 142 are formed in the substrate and have substantially the same depth.

The third recess 132 and the fourth recess 142 may be formed on the first active region I, for example, using an etching process including a dry etching process or a wet etching process.

The third recess 132 and the fourth recess 142 may undercut the first gate pattern 110 and the second gate pattern 120. For example, parts of the third recess 132 and the fourth recess 142 may include a curved side surface under the first gate pattern 110 and the second gate pattern 120. The side surface of the third recess 132 and the fourth recess 142 forms a curved surface, but is not limited thereto. The third recess 132 and the fourth recess 142 may be formed using an isotropic etching process. Alternatively, the third recess 132 and the fourth recess 142 are formed using anisotropic etching, and the third recess 132 and the fourth recess 142 may have a box-shaped cross section. For example, the third recess 132 may have a width substantially equal to a distance between the first gate pattern 110 or the second gate pattern 120 and an upper surface of the isolation film 105. Similarly, the fourth recess 142 may have a width substantially equal to a distance between the first gate pattern 110 and the second gate pattern 120.

Figure 5:
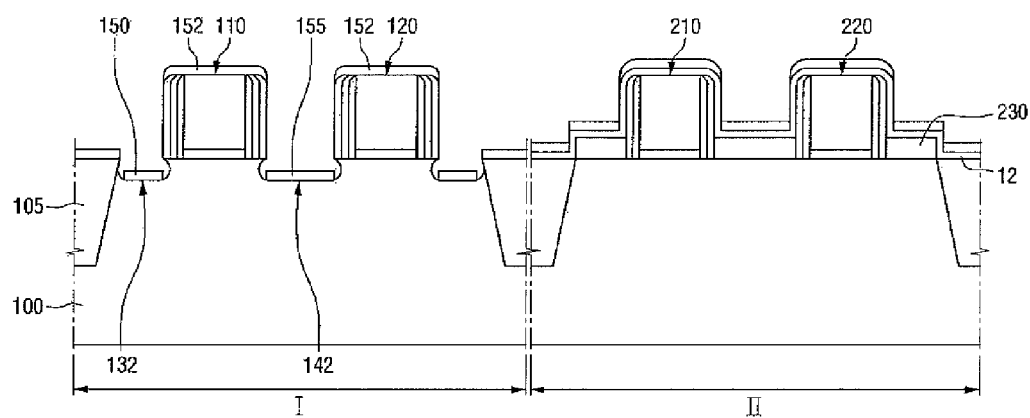

Referring to FIG. 5, a first sacrificial film pattern 150 and a second sacrificial film pattern 155 are formed on bottom surfaces of the third recess 132 and the fourth recess 142 formed on the first active region I. When the first sacrificial film pattern 150 and the second sacrificial film pattern 155 are formed, a third sacrificial film pattern 152 is further formed on upper surfaces of the first gate pattern 110 and the second gate pattern 120 which are formed on the first active region I. The first to third sacrificial film patterns 150, 155, and 152 may be formed using a directional deposition process. Further, the first to third sacrificial film patterns 150, 155, and 152 may have substantially the same thickness.

Since the first sacrificial film pattern 150 and the second sacrificial film pattern 155, which are formed on the bottom surfaces of the third recess 132 and the fourth recess 142, are formed using a directional deposition process, the first sacrificial film pattern 150 and the second sacrificial film pattern 155 are not formed on the side surfaces of the third recess 132 and the fourth recess 142. The third sacrificial film pattern 152, which is formed on the upper surfaces of the first gate pattern 110 and the second gate pattern 120, is not formed on side surfaces of the first gate pattern 110 and the second gate pattern 120.

The directional deposition process for forming the first sacrificial film pattern 150 and the second sacrificial film pattern 155 may include a GCIB (Gas Cluster Ion Beam) process, a plasma deposition process, but is not limited thereto. For example, a deposition method using a plasma source and a bias will suffice to perform a directional or non-conformal deposition to form the first sacrificial film pattern 150 and the second sacrificial film pattern 155.

The thicknesses of the first sacrificial film pattern 150 and the second sacrificial film pattern 155 may be, for example, smaller than the depths of the third recess 132 and the fourth recess 142.

The first sacrificial film pattern 150 and the second sacrificial film pattern 155 may include, but are limited to, silicon oxide, silicon nitride, or silicon oxynitride. The first sacrificial film pattern 150 and the second sacrificial film pattern 155 may have etch selectivity with respect to a spacer that is disposed on the first gate pattern 110 and the second gate pattern 120. For example, if the outeunost spacer (e.g., the second blocking block 12) that is disposed on the first gate pattern 110 and the second gate pattern 120 includes silicon nitride, the first sacrificial film pattern 150 and the second sacrificial film pattern 155 may include silicon oxide.

When the first sacrificial film pattern 150 and the second sacrificial film pattern 155 are formed using a directional deposition process, a sacrificial film pattern is also formed on the second active region II that is covered by the second blocking film 12. The sacrificial film pattern on the second active region II is also formed on the upper surfaces of the third gate pattern 210 and the fourth gate pattern 220, but is not formed on the side surfaces of the third gate pattern 210 and the fourth gate pattern 220.

Figure 6:
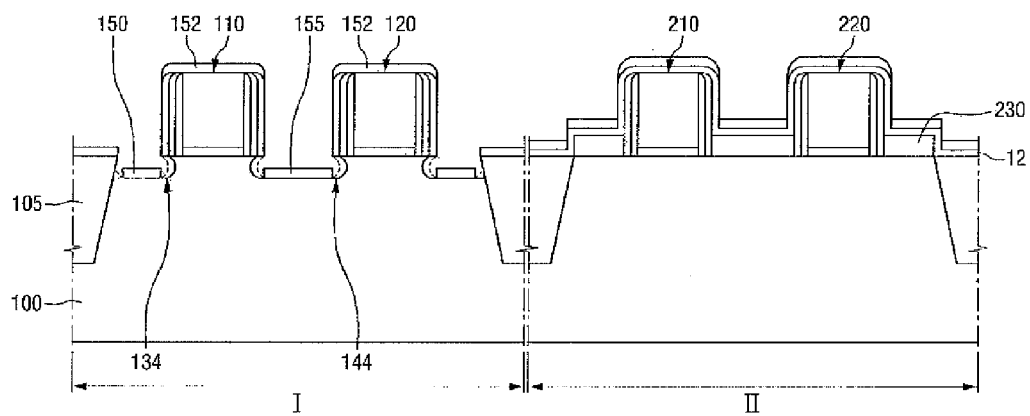

Referring to FIG. 6, a fifth recess 134 and a sixth recess 144 are formed by laterally extending the third recess 132 and the fourth recess 142 formed on the first active region I. For example, the fifth recess 134 is formed by laterally extending the third recess 132 in the width direction, and the sixth recess 144 is formed by extending the fourth recess 142 in the width direction.

The fifth recess 134 and the sixth recess 144 may be formed using an isotropic etching process including a wet etching process or a dry etching process. The dry etching may be performed using $CF_4$, HBr, or $Cl_2$. The wet etching may be performed using KOH, HCl, TMAH (Tetra Methyl Ammonium Hydroxide) or TEAR (Tetra Ethyl Ammonium Hydroxide). However, the inventive concept is not limited thereto.

The fifth recess 134 that is formed through extension of the width of the third recess 132 undercuts the first gate pattern 110 or the second gate pattern 120. The sixth recess 144 that is formed through extension of the width of the fourth recess 142 undercuts the first gate pattern 110 and the second gate pattern 120. For example, the first gate pattern 110 and the second gate pattern 120 may include overhang portions disposed on the fifth recess 134 and the sixth recess 144.

The third recess 132, which is formed between the first gate pattern 110 and the isolation film 105 and between the second gate pattern 120 and the isolation film 105, exposes a side surface of the isolation film 105. For example, the side surface of the third recess 132 on the side of the isolation film 105 includes the side surface of the isolation film 105.

Referring to FIG. 6, parts of bottom surfaces of the fifth recess 134 and the sixth recess 144, which are not covered by the first sacrificial film pattern 150 and the second sacrificial film pattern 155, may be removed when the widths of the third recess 132 and the fourth recess 142 are extended in the width direction by performing an etching process on the third recess 132 and the fourth recess 142.

Figure 7:
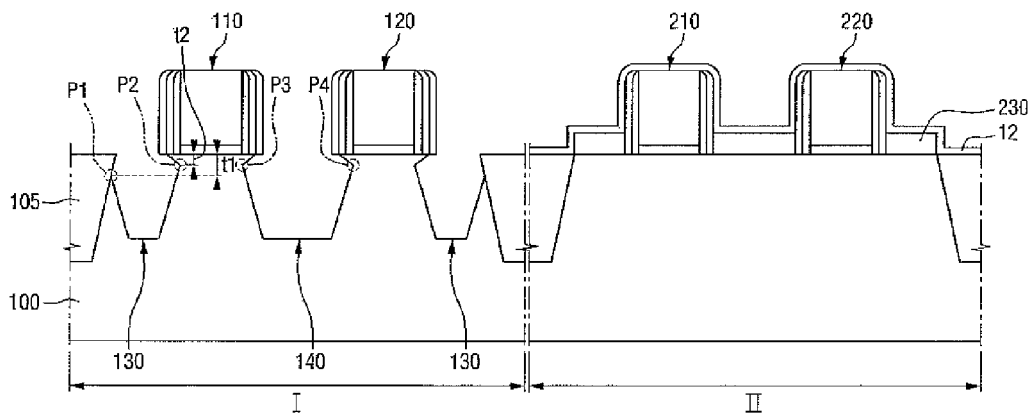

Referring to FIG. 7, the first recess 130 and the second recess 140 may be formed by etching the fifth recess 134 and the sixth recess 144 which are formed on the first active region I. The first recess 130 and the second recess 140 may be formed, for example, by a wet etching process. The wet etching may be performed, for example, using ammonium hydroxide ($NH_4OH$) or the like, but is not limited thereto.

For example, the first sacrificial film pattern 150 and the second sacrificial film pattern 155, which remain on the bottom surfaces of the fifth recess 134 and the sixth recess 144, are removed. When the first sacrificial film pattern 150 and the second sacrificial film pattern 155 are removed, the third sacrificial film pattern that remains on the upper surfaces of the first gate pattern 110 and the second gate pattern 120 is removed, and the sacrificial film pattern that is formed on the second active region II is also removed.

Thereafter, the first recess 130 and the second recess 140 are formed by wet-etching the fifth recess 134 and the sixth recess 144. For example, the first recess 130 is formed between the first gate pattern 110 and the isolation film 105 and between the second gate pattern 120 and the isolation film 105 through wet etching of the fifth recess 134. The second recess 140 is formed between the first gate pattern 110 and the second gate pattern 120 through wet etching of the sixth recess 144.

The first recess 130 and the second recess 140 are formed by performing a wet etching process on the fifth recess 134 and the sixth recess 144 and expose a crystal plane of the substrate 100.

In an exemplary embodiment, the first recess 130 and the second recess 140 may include a sigma shape in a cross-sectional view.

The first recess 130, which is formed between the first gate pattern 110 and the isolation film 105 and between the second gate pattern 120 and the isolation film 105, may include a first tip P1 and a second tip P2. The second recess 140, which is formed between the first gate pattern 110 and the second gate pattern 120, may include a third tip P3 and a fourth tip P4. The first tip P1 of the first recess 130 is located at a depth that is different from that of the second tip P2 of the first recess 130. For example, the first depth t1 of the first tip P1 is different from the second depth t2 of the second tip P2. In an exemplary embodiment, the first depth t1 of the first tip P1 may be greater than the second depth t2 of the second tip P2.

However, the third tip P3 of the second recess 140 and the fourth tip P4 of the second recess 140 may be located at substantially the same depth. Further, the third tip P3 of the second recess 140 and the fourth tip P4 of the second recess 140 may be located at substantially the same depth as the second tip P2 of the first recess 130.

Hereinafter, referring to FIGS. 6 and 7, it will be explained that the first sacrificial film pattern 150 and the second sacrificial film pattern 155 may serve to form a tip closer to a channel and thus the performance of a semiconductor device may be increased.

For example, an isotropic etching process may be performed on the third recess 132 having a bottom surface on which the first sacrificial film pattern 150 is formed and the fourth recess 142 having a bottom surface on which the second sacrificial film pattern 155 is formed, and thus the fifth recess 134 and the sixth recess 144 may be formed. The fifth recess 134 and the sixth recess 144 may include curved surfaces which move into lower portions of the first gate pattern 110 and the second gate pattern 120. The first recess 130 and the second recess 140, formed by performing a wet etching process on the fifth recess 134 and the sixth recess 144, may include the second tip P2 of the first recess 130 and the third tip P3 of the second recess 140 which are closer to the channel region of the first gate pattern 110. When the first recess 130 and the second recess 140 have the second tip P2 and the third tip P3 closer to the channel region of the first gate pattern 110 and are filled with a material having a larger lattice constant than that of the substrate 100, the second tip P2 and the third tip P3 may apply a compressive stress to the channel region of the first gate pattern 110, and thus the performance of the semiconductor device is increased.

Figure 8:
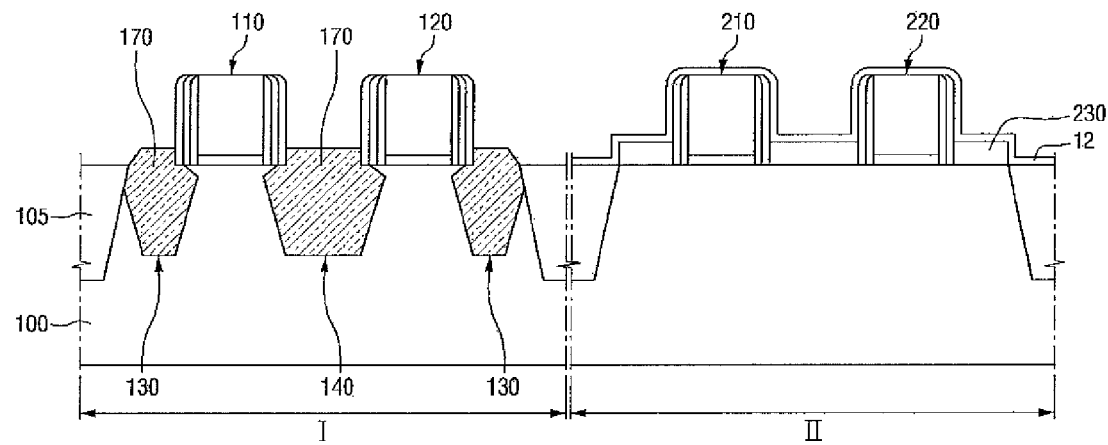

Referring to FIG. 8, a semiconductor pattern 170 is formed in the first recess 130 and the second recess 140 of the first active region I. The semiconductor pattern 170 may be formed to project beyond the boundary line between the first gate pattern 110 and the substrate 100, but is not limited thereto. The semiconductor pattern 170 may include a first source/drain of a transistor that is formed on the first active region I.

The semiconductor pattern 170 may be formed using an epitaxial growth process. A semiconductor material may be formed in the first recess 130 and the second recess 140. For example, the semiconductor pattern 170 may include a single-crystal epitaxial layer. The semiconductor pattern 170 may be formed, for example, by a CVD process or an ALD process. In the case where the semiconductor pattern 170 applies a tensile or compressive stress to a channel region of the gate patterns 110 and 120, the semiconductor pattern 170 may include a material that has a different lattice constant from that of the substrate 100, but is not limited thereto.

For example, the first active region I may include a PMOS forming region, and the semiconductor pattern 170 may include silicon germanium (SiGe).

Referring to FIGS. 2, and 9 to 13, a method for fabricating a semiconductor device according to an exemplary embodiment of the inventive concept will be described. This embodiment is substantially the same as the above-described embodiment, except that a second source/drain is formed on a second active region after a semiconductor pattern is formed on the first active region. A description of substantially similar elements will be simplified or omitted.

FIGS. 9 to 13 are views explaining intermediate steps of a method for fabricating a semiconductor device according to another embodiment of the inventive concept.

Figure 9:
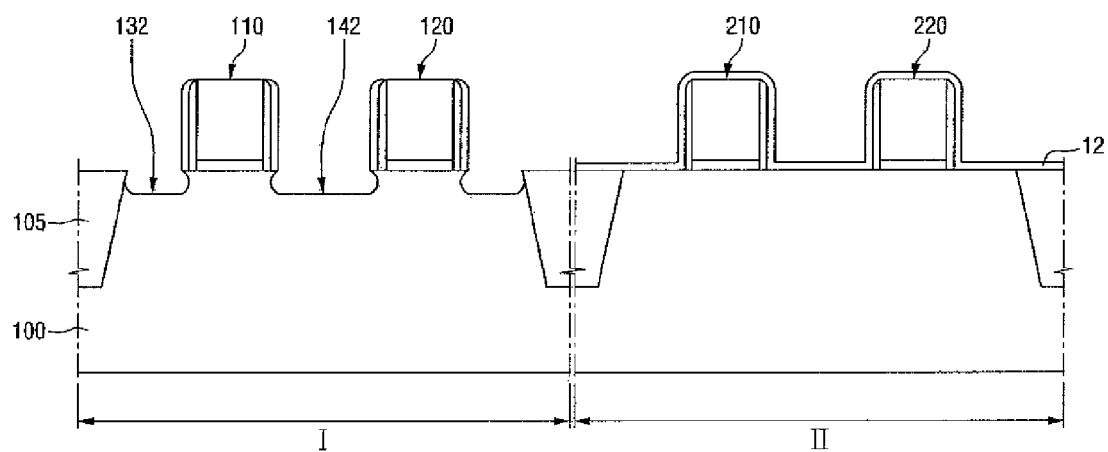
FIGS. 9 to 13 are cross-sectional views illustrating steps of a method for fabricating a semiconductor device according to an exemplary embodiment of the inventive concept.

Referring to FIGS. 2 and 9, a third recess 132 and a fourth recess 142 are formed on both sides of the first gate pattern 110 and the second gate pattern 120 which are formed on the second active region II. For example, the third recess 132 is formed between the first gate pattern 110 or the second gate pattern 120 and the isolation film 105, and the fourth recess 142 is formed between the first gate pattern 110 and the second gate pattern 120.

For example, a blocking film is formed on the first active region I and the second active region II. The blocking film is formed on the first to fourth gate patterns 110, 120, 210, and 220.

Thereafter, the substrate 100 of the first active region I, the first gate pattern 110, and the second gate pattern 120 are exposed by removing the blocking film on the first active region I. At the same time, a second blocking film 12 is formed on the second active region II. Although the blocking film on the first active region I is removed, the block film on side walls of the first gate pattern 110 and the second gate pattern 120 of the first active region I may remain as spacers.

Thereafter, a third recess 132 is formed by etching the exposed substrate 100 between the first gate pattern 110 or the second gate pattern 120 and the isolation film 105. A fourth recess 142 is formed by removing the exposed substrate 100 between the first gate pattern 110 and the second gate pattern 120.

Figure 10:
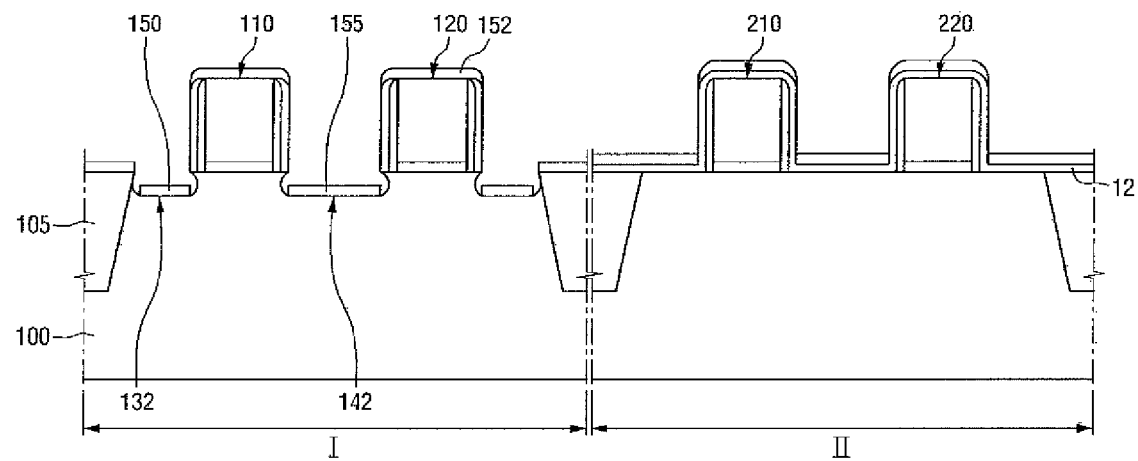

Referring to FIG. 10, a first sacrificial film pattern 150 and a second sacrificial film pattern 155 are formed on bottom surfaces of the third recess 132 and the fourth recess 142 formed on the first active region I. When the first sacrificial film pattern 150 and the second sacrificial film pattern 155 are formed, a third sacrificial film pattern 152 is also formed on upper surfaces of the first gate pattern 110 and the second gate pattern 120 which are formed on the first active region I. The first to third sacrificial film patterns 150, 155, and 152 are formed using a directional or non-conformal deposition process. Further, the first to third sacrificial film patterns 150, 155, and 152 may be formed to have substantially the same thickness.

Since the first sacrificial film pattern 150 and the second sacrificial film pattern 155, which are formed on the bottom surfaces of the third recess 132 and the fourth recess 142, are formed using a directional deposition process, the first sacrificial film pattern 150 and the second sacrificial film pattern 155 are not formed on side surfaces of the third recess 132 and the fourth recess 142.

Figure 11:
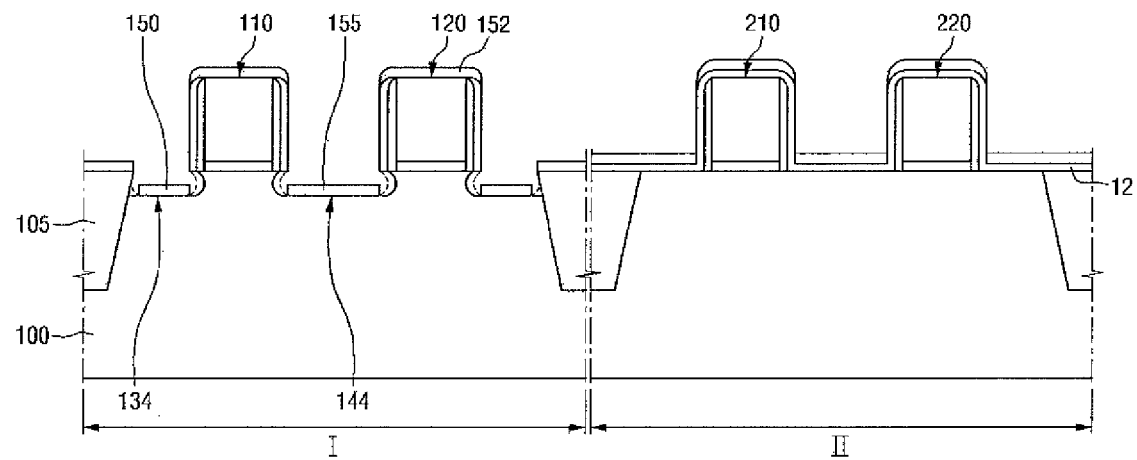

Referring to FIG. 11, a fifth recess 134 and a sixth recess 144 are formed through extension of the widths of the third recess 132 and the fourth recess 142 which are formed on the first active region I. For example, the fifth recess 134 is formed through extension of the third recess 132 in the width direction, and the sixth recess 144 is formed through extension of the fourth recess 142 in the width direction.

The fifth recess 134 and the sixth recess 144 may be formed using an isotropic etching process, and for example, using a wet etching process or a dry etching process.

The fifth recess 134 and the sixth recess 144 undercut the first and the second gate pattern 110 and 120 to form space under the first and the second gate pattern 110 and 120.

Figure 12:
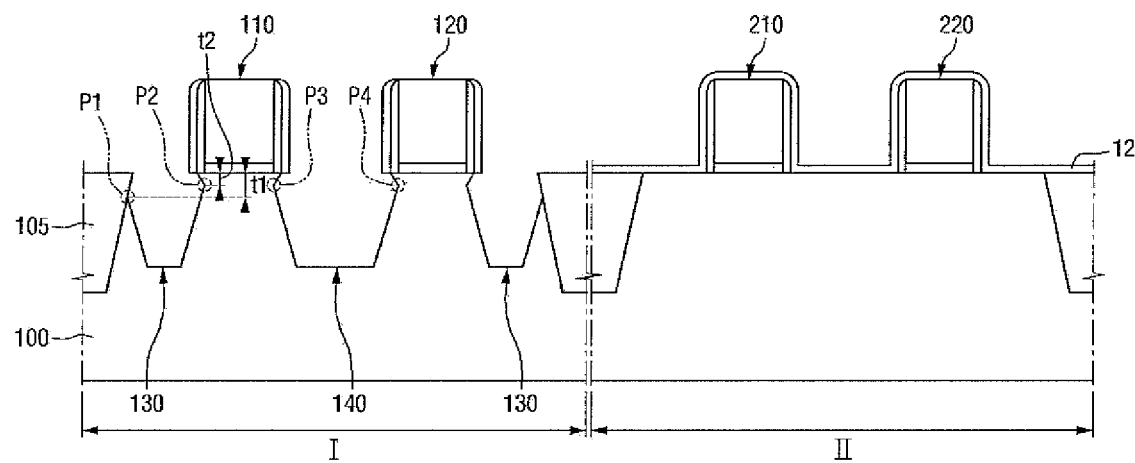

Referring to FIG. 12, the first recess 130 and the second recess 140 may be formed by etching the fifth recess 134 and the sixth recess 144 which are formed on the first active region I. The first recess 130 and the second recess 140 may be formed, for example, by a wet etching process.

For example, the first sacrificial film pattern 150 and the second sacrificial film pattern 155, which remain on the bottom surfaces of the fifth recess 134 and the sixth recess 144, are removed. Thereafter, the first recess 130 and the second recess 140 are formed by wet-etching the fifth recess 134 and the sixth recess 144.

Figure 13:
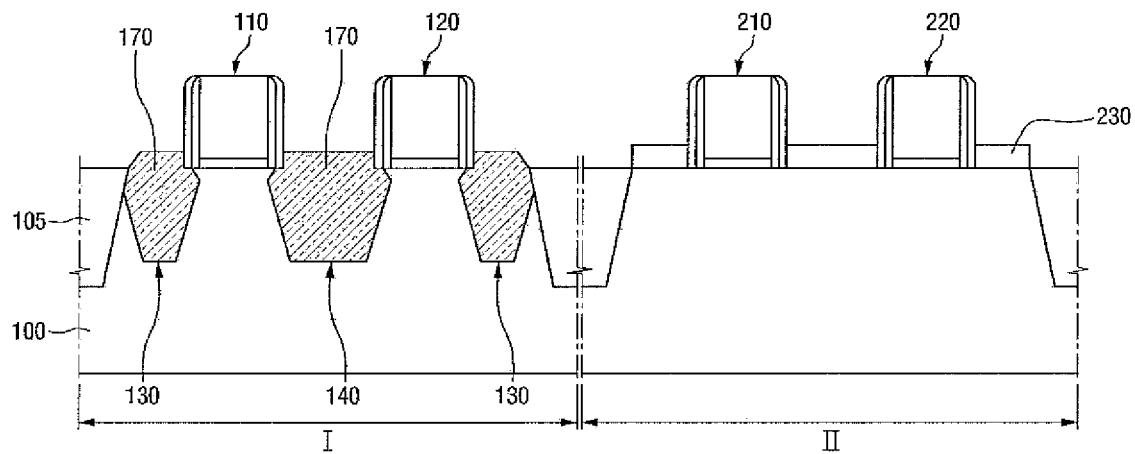

Referring to FIG. 13, a semiconductor pattern 170 is formed in the first recess 130 and the second recess 140 of the first active region I. The semiconductor pattern 170 may be formed to project beyond the boundary line between the first gate pattern 110 and the substrate 100, but is not limited thereto.

Thereafter, the substrate 100 is exposed by removing the second blocking film 12 formed on the second active region II. For example, the substrate 100, which is located between the third gate pattern 210 and the isolation film 105, between the fourth gate pattern 220 and the isolation film 105, and between the third gate pattern 210 and the fourth gate pattern 220, is exposed.

Thereafter, a second source/drain layer 230 is formed on both sides of the third gate pattern 210 and the fourth gate pattern 220 which are formed on the second active region II. For example, the second source/drain layer 230 may be formed on the exposed surface of the substrate 100. The second source/drain layer 230 may include an epitaxial layer, and for example, may be formed using a CVD process.

Figure 14:
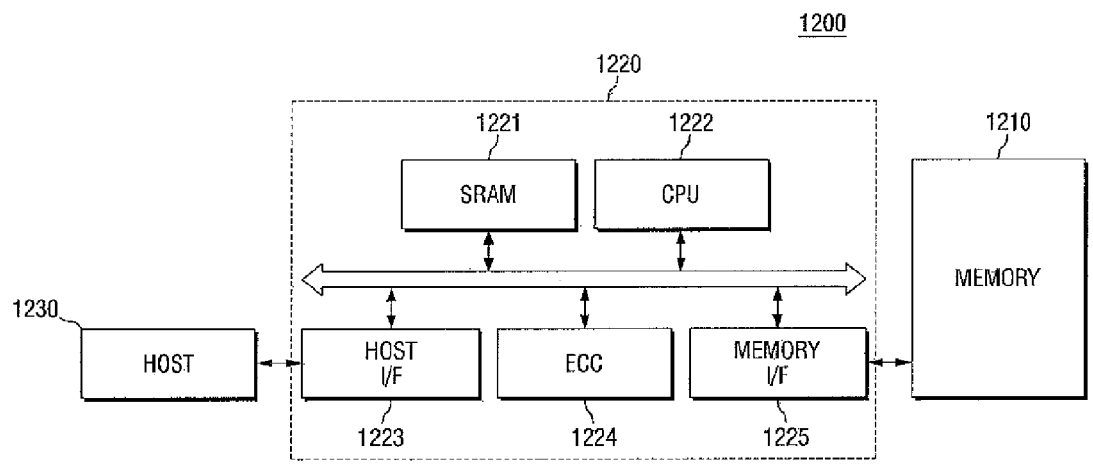
FIG. 14 is a block diagram of a memory card that includes a semiconductor device fabricated according to an exemplary embodiment of the inventive concept.

FIG. 14 is a block diagram of a memory card that includes a semiconductor device fabricated according to an exemplary embodiment of the inventive concept.

Referring to FIG. 14, a memory 1210 that includes a semiconductor device fabricated according to an exemplary embodiment of the inventive concept may be incorporated in a memory card 1200. The memory card 1200 may include a memory controller 1220 that controls date exchange between a host 1230 and the memory 1210. A static random access memory (SRAM) 1221 may be used as an operating memory of a central processing unit 1222. A host interface 1223 may include a protocol for the host 1230 to access the memory card 1200 to perform date exchange. An error correction code 1224 may detect and correct errors of data read from the memory 1210. A memory interface 1225 may interface with the memory 1210. The central processing unit 1222 may perform a control operation related to data exchange with the memory controller 1220.

Figure 15:
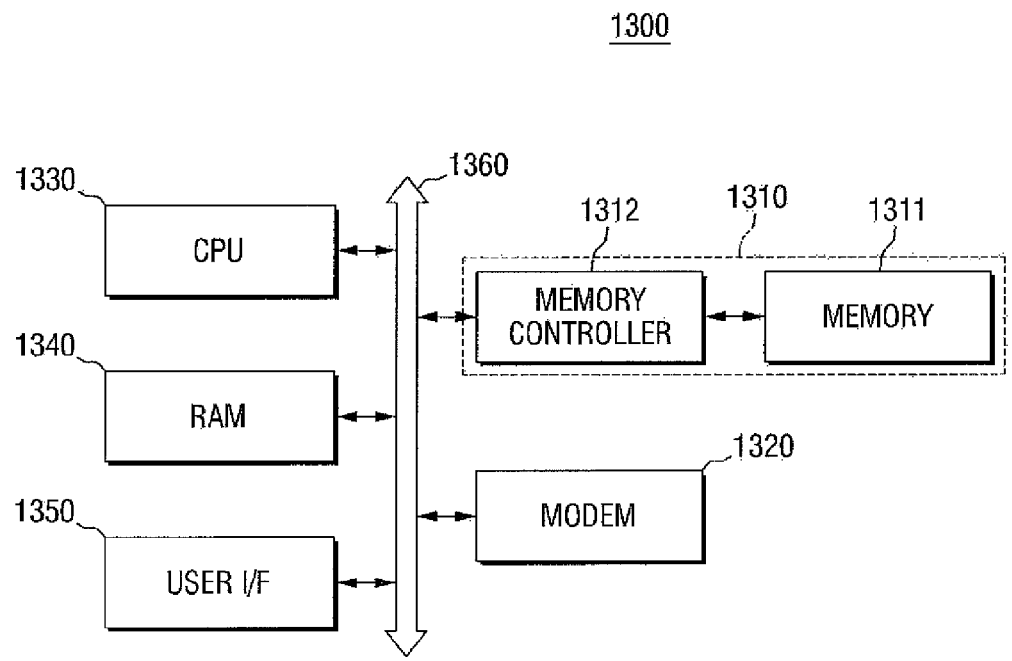
FIG. 15 is a block diagram of an information processing system using a semiconductor device fabricated according to an exemplary embodiment of the inventive concept.

FIG. 15 is a block diagram of an information processing system using a semiconductor device fabricated according to an exemplary embodiment of the inventive concept; and Referring to FIG. 15, an information processing system 1300 may include a memory system 1310 that includes the semiconductor device fabricated according to an exemplary embodiment of the inventive concept. The information processing system 1300 may include the memory system 1310, a modem 1320, a central processing unit 1330, a random access memory (RAM) 1340, and a user interface 1350, which are electrically connected to a system bus 1360. The memory system 1310 may include a memory 1311 and a memory controller 1312, and may have substantially the same configuration as the memory card 1200 illustrated in FIG. 14. Data that is processed by the central processing unit 1330 and data that is received from an external device may be stored in the memory system 1310. The information processing system 1300 may be applied to a memory card, a solid-state drive (SSD), a camera image sensor, and other various chipsets. For example, the memory system 1310 may be configured to adopt the SSD, and in this case, the information processing system 1300 may stably and reliably process large-capacity data.

Figure 16:
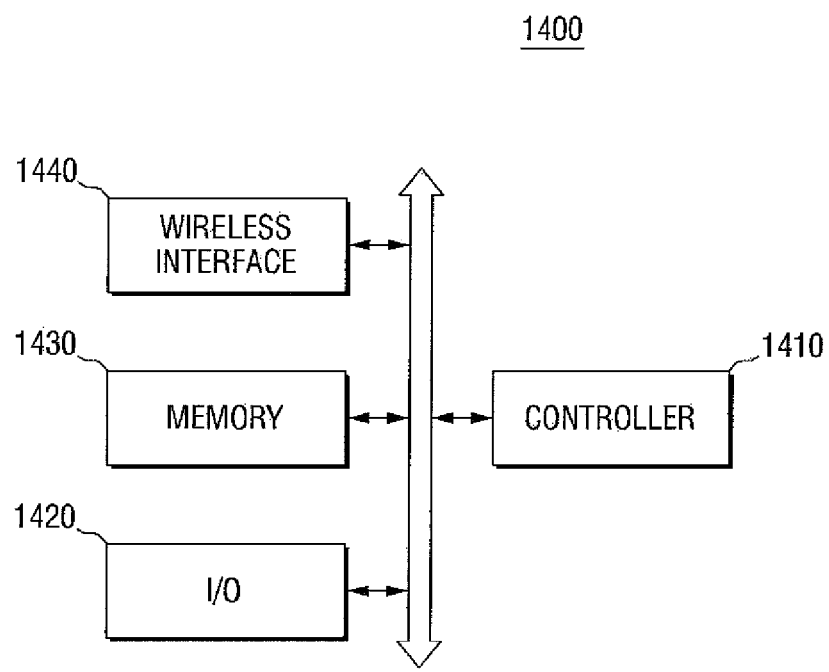
FIG. 16 is a block diagram of an electronic device including a semiconductor device fabricated according to an exemplary embodiment of the inventive concept.

FIG. 16 is a block diagram of an electronic device including a semiconductor device fabricated according to an exemplary embodiment of the inventive concept.

Referring to FIG. 16, an electronic device 1400 may include a semiconductor device fabricated according to an exemplary embodiment of the inventive concept. The electronic device 1400 may be used in wireless communication devices (for example, a personal digital assistant (PDA), a notebook, a portable computer, a web tablet, a wireless phone, and/or a wireless digital music player) or various devices that are capable of sending and receiving information in wireless communication environments.

The electronic device 1400 may include a controller 1410, an input/output device 1420, a memory 1430, and a wireless interface 1440. Here, the memory 1430 may include a semiconductor device fabricated according to an exemplary embodiment of the inventive concept. The controller 1410 may include a microprocessor, a digital signal processor, or a similar processor. The memory 1430 may be used to store commands (or user data) processed by the controller 1410. The wireless interface 1440 may be used to send and receive data through a wireless data network. The wireless interface 1440 may include an antenna and/or a wireless transceiver. The electronic device 1400 may use, for example, a third generation communication system protocol, such as CDMA, GSM, NADC, E-TDMA, WCDMA, or CDMA2000.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for fabricating a semiconductor device, comprising:
    forming a first gate pattern and a second gate pattern on an active region of a substrate that is defined by an isolation film;
    forming a first recess between the first gate pattern and the second gate pattern;
    forming a first sacrificial film pattern on a bottom surface of the first recess using a directional deposition process; and
    forming a second recess by etching the first recess using the first sacrificial film pattern as an etch mask, wherein the first recess extends laterally and forms the second recess, wherein the forming of the first sacrificial film pattern comprises forming a third sacrificial film pattern on upper surfaces of the first gate pattern and the second gate pattern, respectively.

2. The method for fabricating the semiconductor device of claim 1, wherein the first sacrificial film pattern is not formed on a side wall of the first recess under the first gate pattern.

3. The method for fabricating the semiconductor device of claim 1, further comprising forming a third recess by etching the second recess.

4. The method for fabricating the semiconductor device of claim 3, wherein the forming of the third recess comprises:
    removing the first sacrificial film pattern provided in the second recess; and
    performing a wet etching process on the second recess to form the third recess.

5. The method for fabricating the semiconductor device of claim 1, wherein the first gate pattern is formed adjacent to the isolation film,
    wherein the forming of the first recess further includes forming a fourth recess between the first gate pattern and the isolation film,
    wherein the forming of the first sacrificial film pattern further includes forming a second sacrificial film pattern on a bottom surface of the fourth recess, and
    wherein the forming of the second recess further includes forming a fifth recess by etching the fourth recess using the second sacrificial film pattern as a etch mask, wherein the fourth recess extends laterally and forms the fifth recess.

6. The method for fabricating the semiconductor device of claim 5, further comprising forming a third recess and a sixth recess each having sigma-shaped cross sections by performing a wet etching process on the second recess and the fifth recess.

7. The method for fabricating the semiconductor device of claim 6, wherein the sixth recess includes a first tip and a second tip, wherein the first tip is located at a first depth measured from an upper surface of the active region, and the second tip is located at a second depth different from the first depth and measured from the upper surface of the active region.

8. The method for fabricating the semiconductor device of claim 1, wherein the forming of the second recess comprises forming the second recess using an isotropic etching process including a dry etching process or a wet etching process.

9. A method for fabricating a semiconductor device, comprising:
    forming a first gate pattern on a PMOS forming region of a substrate and forming a second gate pattern on an NMOS forming region of the substrate;
    forming a first recess on both sides of the first gate pattern;
    forming a sacrificial film, pattern on a bottom surface of the first recess using a directional deposition process; and
    forming a second recess by etching the first recess using the first sacrificial film pattern as an etch mask,
    wherein the sacrificial film pattern is formed on an upper surface of the first gate pattern.

10. The method for fabricating the semiconductor device of claim 9, further comprising forming a source/drain layer on both sides of the second gate pattern before forming the first recess.

11. The method for fabricating the semiconductor device of claim 9, wherein the sacrificial film pattern is not formed on a side wall of the first recess.

12. The method for fabricating the semiconductor device of claim 9, further comprising forming a third recess by etching the second recess, and forming a source/drain layer on both sides of the second gate pattern after forming the third recess.

13. The method for fabricating the semiconductor device of claim 12, wherein the forming of the third recess comprises removing the sacrificial film pattern provided in the second recess, and etching the second recess by performing a wet etching process on the second recess.

14. A method for fabricating a semiconductor device, comprising:
    forming a first gate pattern and a second gate pattern on an active region of a substrate, wherein the active region is defined by an isolation film formed in the substrate;
    forming a first recess having a bottom surface and a first curved side surface in the substrate, wherein the bottom surface is disposed under a region between the first gate pattern and the second gate pattern and the first curved side surface is disposed under the first gate pattern;
    forming a sacrificial layer on the bottom surface of the first recess;
    performing an isotropic etching process on the first recess using the sacrificial layer as an etch mask to form a second recess, wherein the second recess includes a second curved side surface disposed farther from the sacrificial layer than the first curved side surface; and
    forming a sigma-shaped recess by etching the second recess.

15. The method of claim 14, wherein the second recess is formed by an isotropic etching process, wherein the sacrificial layer is configured to protect the bottom surface under the sacrificial layer from the isotropic etching process.

16. The method of claim 14, wherein the sigma-shaped recess includes a tip disposed under the gate pattern, wherein the tip includes a pointed portion on a side of the sigma-shaped recess.

17. The method of claim 14, wherein the sacrificial layer is formed using a directional deposition process.

18. The method of claim 14, wherein the sacrificial layer includes silicon oxide, silicon nitride, or silicon oxynitride.

* * * * *